United States Patent
Nagashima et al.

(10) Patent No.: US 9,324,427 B2
(45) Date of Patent: *Apr. 26, 2016

(54) NONVOLATILE SEMICONDUCTOR MEMORY DEVICE

(71) Applicant: KABUSHIKI KAISHA TOSHIBA, Minato-ku (JP)

(72) Inventors: Hiroyuki Nagashima, Yokohama (JP); Hirofumi Inoue, Kamakura (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/479,563

(22) Filed: Sep. 8, 2014

(65) Prior Publication Data

US 2014/0376302 A1 Dec. 25, 2014

Related U.S. Application Data

(63) Continuation of application No. 13/768,359, filed on Feb. 15, 2013, now Pat. No. 8,842,481, which is a continuation of application No. 13/099,540, filed on May 3, 2011, now Pat. No. 8,391,082, which is a continuation of application No. 12/511,443, filed on Jul. 29, 2009, now Pat. No. 7,957,203.

(30) Foreign Application Priority Data

Jul. 31, 2008 (JP) ................................ 2008-197608

(51) Int. Cl.
*G11C 7/10* (2006.01)
*G11C 13/00* (2006.01)
(Continued)

(52) U.S. Cl.
CPC .......... *G11C 13/0069* (2013.01); *G11C 7/1006* (2013.01); *G11C 7/1051* (2013.01);
(Continued)

(58) Field of Classification Search
CPC .......... G11C 8/16; G11C 7/22; G11C 7/1075; G11C 7/1006; G11C 7/1051
USPC ...................... 365/189.04, 148, 189.011, 218
See application file for complete search history.

(56) References Cited

U.S. PATENT DOCUMENTS 6,618,286 B2 9/2003 Hiroshi Kato et al.
6,888,773 B2 5/2005 Morimoto
(Continued)

FOREIGN PATENT DOCUMENTS

JP 2005-108395 A 4/2005
JP 2008-159178 7/2008
(Continued)

OTHER PUBLICATIONS

Office Action issued Aug. 28, 2012 in Japanese Patent Application No. 2008-197608 with English language translation.
(Continued)

*Primary Examiner* — Pho M Luu
(74) *Attorney, Agent, or Firm* — Oblon, McClelland, Maier & Neustadt, L.L.P.

(57) ABSTRACT

A nonvolatile semiconductor memory device includes: a cell array including MATs (unit cell arrays) arranged in matrix, each of the MATs having memory cells, each of the memory cells having a variable resistive element of which resistance is nonvolatilely stored as data; and write/erase circuits connected to the MATs and operative to execute data write or erase to the memory cells inside the MATs in accordance with input data. A part of the write/erase circuits writes data to memory cells inside a corresponding MAT while another part of the write/erase circuits erases data from memory cells inside a corresponding MAT at the same time.

14 Claims, 14 Drawing Sheets

(51) Int. Cl.
*G11C 8/16* (2006.01)
*G11C 7/22* (2006.01)

(52) U.S. Cl.
CPC ............... *G11C7/1075* (2013.01); *G11C 7/22* (2013.01); *G11C 8/16* (2013.01); *G11C 13/0004* (2013.01); *G11C 13/0007* (2013.01); *G11C 13/0011* (2013.01); *G11C 13/0061* (2013.01); *G11C 13/0097* (2013.01); *G11C 2013/0076* (2013.01); *G11C 2013/0078* (2013.01); *G11C 2013/0092* (2013.01); *G11C 2213/31* (2013.01); *G11C 2213/72* (2013.01); *G11C 2216/24* (2013.01)

(56) References Cited

U.S. PATENT DOCUMENTS

| | | | |
|---|---|---|---|
| 7,248,494 B2 | 7/2007 | Hyung-Rok Oh et al. | |
| 7,535,746 B2 | 5/2009 | Kawazoe et al. | |
| 7,649,777 B2 | 1/2010 | Ichige et al. | |
| 7,957,203 B2 * | 6/2011 | Nagashima | G11C 13/0007 365/148 |
| 8,149,609 B2 * | 4/2012 | Nagashima | G11C 8/10 365/148 |
| 8,199,557 B2 * | 6/2012 | Maejima | G11C 13/0061 365/148 |
| 8,391,082 B2 * | 3/2013 | Nagashima | G11C 13/0007 365/148 |
| 8,565,004 B2 * | 10/2013 | Iijima | G11C 11/5685 365/148 |
| 8,842,481 B2 * | 9/2014 | Nagashima | G11C 13/0007 365/148 |
| 8,947,905 B2 * | 2/2015 | Chang | G11C 11/5685 365/148 |
| 9,053,787 B2 * | 6/2015 | Shimakawa | G11C 13/0007 |
| 2011/0242875 A1 | 10/2011 | Nakashima et al. | |

FOREIGN PATENT DOCUMENTS

| | | |
|---|---|---|
| WO | WO 2008/012871 A1 | 1/2008 |
| WO | WO 2008/032394 A1 | 3/2008 |

OTHER PUBLICATIONS

Office Action (with English translation) mailed on Nov. 20, 2012, in counterpart Japanese Appln No. 2008-197608 (9 pages).

* cited by examiner

US 9,324,427 B2

NONVOLATILE SEMICONDUCTOR MEMORY DEVICE

CROSS-REFERENCE TO RELATED APPLICATION

This application is a continuation of and claims the benefit of priority under 35 U.S.C. §120 from U.S. application Ser. No. 13/768,359, now U.S. Pat. No. 8,842,481, filed Feb. 15, 2013, which is a continuation of U.S. application Ser. No. 13/099,540, filed May 3, 2011, now U.S. Pat. No. 8,391,082, which is a continuation of U.S. application Ser. No. 12/511,443, now U.S. Pat. No. 7,957,203, filed Jul. 29, 2009, and claims the benefit of priority from the prior Japanese Patent Application No. 2008-197608, filed on Jul. 31, 2008, the entire contents of which are incorporated herein by reference.

BACKGROUND OF THE INVENTION

1. Field of the Invention

The present invention relates to a nonvolatile semiconductor memory device using a variable resistive element of which resistance is stored as data.

2. Description of the Related Art

Electrically erasable programmable nonvolatile memories include a flash memory as well known in the art, which comprises a cell array of NAND-connected or NOR-connected memory cells having a floating gate structure. A ferroelectric memory is also known as a nonvolatile fast random access memory.

On the other hand, technologies of patterning memory cells much finer include a resistance variable memory, which uses a variable resistive element in a memory cell as proposed. Known examples of the variable resistive element include a phase change memory device that varies the resistance in accordance with the variation in crystal/amorphous states of a chalcogenide compound; an MRAM device that uses a variation in resistance due to the tunnel magneto-resistance effect; a polymer ferroelectric RAM (PFRAM) memory device including resistive elements formed of a conductive polymer; and a ReRAM device that causes a variation in resistance on electrical pulse application (Patent Document 1: JP 2006-344349A, paragraph 0021).

The resistance variable memory may configure a memory cell with a serial circuit of a Schottky diode and a resistance variable element in place of the transistor. Accordingly, it can be stacked easier and three-dimensionally structured to achieve much higher integration as an advantage (Patent Document 2: JP 2005-522045A).

The methods of writing data to such the resistance variable memory include one, which comprises once clearing all memory cells. This method has an advantage because it is sufficient to write data only to the memory cell of question without the need for considering data stored immediately before. This method, however, can not allow the resistance variable memory to sufficiently exert the performance of the operating speed.

SUMMARY OF THE INVENTION

In an aspect the present invention provides a nonvolatile semiconductor memory device, comprising: a cell array including plural MATs (unit cell arrays) arranged in matrix, each MAT containing a plurality of first lines, a plurality of second lines intersecting said plurality of first lines, and a plurality of memory cells connected at intersections of said first and second lines between both lines, each memory cell containing an electrically erasable programmable variable resistive element of which resistance is nonvolatilely stored as data; and a plurality of write/erase circuits connected to said MATS and operative to execute data write or erase to said memory cells inside said MATs in accordance with input data. A part of said plurality of write/erase circuits writes data to memory cells inside a corresponding MAT while another part of said plurality of write/erase circuits erases data from memory cells inside a corresponding MAT at the same time.

In another aspect the present invention provides a nonvolatile semiconductor memory device, comprising: a cell array including Nm MATs (unit cell arrays) (Nm=an integer of 1 or more) arranged in matrix, each MAT containing Na first lines (Na=an integer of 1 or more), Nb second lines (Nb=an integer of 1 or more) intersecting said Na first lines, and a plurality of memory cells connected at intersections of said first and second lines between both lines, each memory cell containing a serial circuit of an electrically erasable programmable variable resistive element of which resistance is nonvolatilely stored as data and a non-ohmic element; and a plurality of write/erase circuits connected to said MATs and operative to execute data write or erase to said memory cells inside said MATs in accordance with input data. A memory cell connected to an a-th first line (a=an integer of 1 to Na) and a b-th second line (b=an integer of 1 to Nb) in an m-th one of said MATs (m=an integer of 1 to Nm) has a logical address i={(a-1)Nb+(b-1)}Nm+(m-1). At the time of data write/erase to a j-th page (j=an integer of 1 to Na×Nb) composed of Nm memory cells having logical addresses Nm(j-1) through Nm(j-1)+(Nm-1), an m1-th one of said write/erase circuits (m1=an integer of 1 to Nm) writes data to said memory cell having the logical address Nm(j-1)+(m1-1) while an m2-th one of said write/erase circuits (m2=an integer of 1 to Nm except m1) erases data from said memory cell having the logical address Nm(j-1)+(m2-1) at the same time.

In yet another aspect the present invention provides a nonvolatile semiconductor memory device, comprising: a cell array including a plurality of first lines, a plurality of second lines intersecting said plurality of first lines, and a plurality of memory cells arranged in matrix and connected at intersections of said first and second lines between both lines, each memory cell containing a serial circuit of an electrically erasable programmable variable resistive element of which resistance is nonvolatilely stored as data and a non-ohmic element; and a plurality of write/erase circuits operative to execute data write or erase to said memory cells in accordance with input data. A certain one of said write/erase circuits writes data to a certain one of said memory cells while another one of said write/erase circuits erases data from another one of said memory cells physically separated from said certain memory cells at the same time.

DETAILED DESCRIPTION OF THE EMBODIMENTS

The embodiments associated with the nonvolatile memory according to the present invention will now be described in detail with reference to the drawings.

First Embodiment

Figure 1:
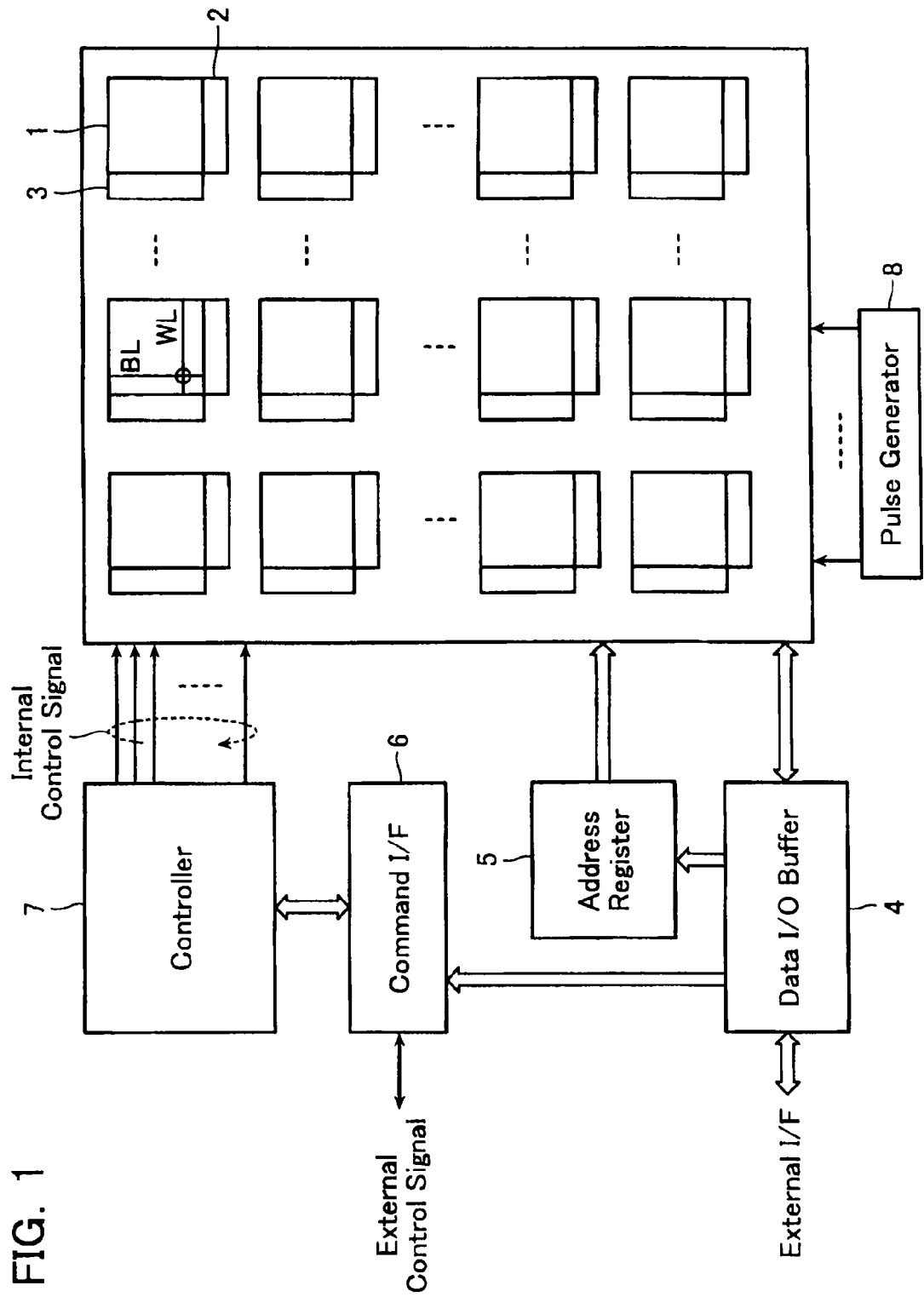
FIG. 1 is a block diagram of a nonvolatile memory according to a first embodiment of the present invention.

FIG. 1 is a block diagram of a nonvolatile memory according to a first embodiment of the present invention.

The nonvolatile memory comprises a plurality of MATs (unit cell arrays) 1, which are arranged in matrix and each use resistance variable elements as memory cells, as in a later-described ReRAM (Resistive RAM) and so forth. It also comprises a plurality of write/erase circuits each including a column control circuit 2 and a row control circuit 3. The column control circuit 2 is operative to control bit lines BL in the MAT 1 and execute erasing data from the memory cells, writing data to the memory cells, and reading data out of the memory cells. The row control circuit 3 is operative to select from among word lines WL in the MAT 1 and apply voltages required for erasing data from the memory cells, writing data to the memory cells, and reading data out of the memory cells.

A data I/O buffer 4 is connected to an external host, not shown, via an I/O line to receive write data, receive erase instructions, provide read data, and receive address data and command data.

The data I/O buffer 4 sends received write data to the column control circuit 2 and receives read-out data from the column control circuit 2 and provides it to external. An address fed from external to the data I/O buffer 4 is sent via an address register 5 to the column control circuit 2 and the row control circuit 3. A command fed from the host to the data I/O buffer 4 is sent to a command interface 6. The command interface 6 receives an external control signal from the host and decides whether the data fed to the data I/O buffer 4 is write data, a command or an address. If it is a command, then the command interface transfers it as a received command signal to a controller 7. The controller 7 manages the entire nonvolatile memory to receive commands from the host, and executes read, write, erase, and data I/O management. The external host can also receive status information managed by the controller 7 and decide the operation result. The status information is also utilized in control of write and erase.

The controller 7 controls the pulse generator 8. Under this control, the pulse generator 8 is allowed to provide a pulse of any voltage and timing. The pulse formed herein can be transferred to any line selected by the column control circuit 2 and the row control circuit 3.

Peripheral circuit elements other than the MATs 1 can be formed in a Si substrate immediately beneath the MATs 1 formed in a wiring layer. Thus, the chip area of the nonvolatile memory can be made almost equal to a total area of the plural MATs 1.

Figure 2:
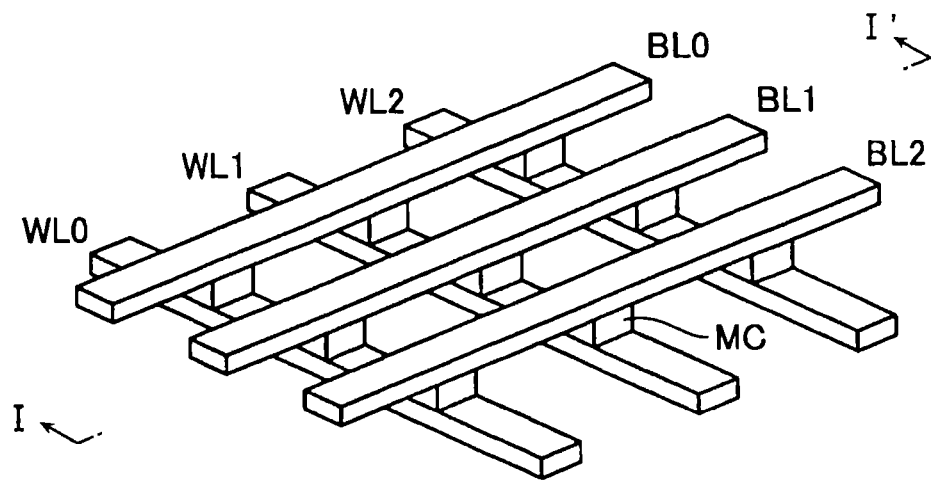
FIG. 2 is a perspective view showing part of a MAT in the nonvolatile memory according to the same embodiment.
Figure 3:
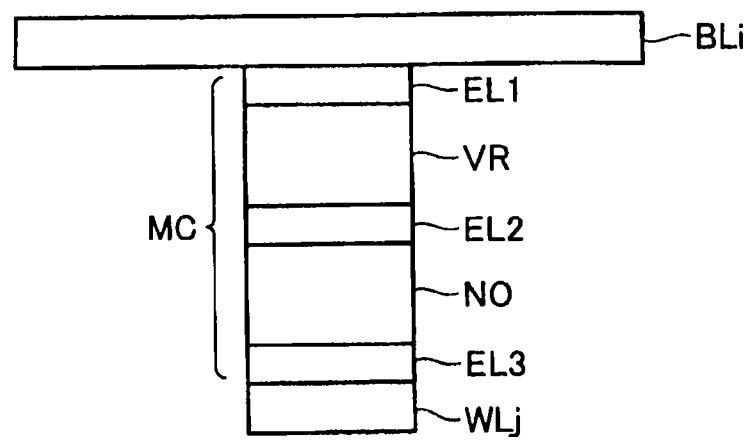
FIG. 3 is a cross-sectional view of one memory cell taken along I-I' line and seen from the direction of the arrow in FIG. 2.

FIG. 2 is a perspective view of part of the MAT 1, and FIG. 3 is a cross-sectional view of one memory cell taken along I-I' line and seen in the direction of the arrow in FIG. 2.

There are plural first lines or word lines WL0-WL2 disposed in parallel, which cross plural second lines or bit lines BL0-BL2 disposed in parallel. A memory cell MC is arranged at each intersection of both lines as sandwiched therebetween. Desirably, the word lines WL and the bit lines BL are composed of heat-resistive low-resistance material such as W, WSi, NiSi, CoSi.

The memory cell MC comprises a serial connection circuit of a variable resistive element VR and a non-ohmic element NO as shown in FIG. 3.

The variable resistive element VR can vary the resistance with current, heat, or chemical energy on voltage application. Arranged on an upper and a lower surface thereof are electrodes EL1, EL2 serving as a barrier metal layer and an adhesive layer. Material of the electrodes may include Pt, Au, Ag, TiAlN, SrRuO, Ru, RuN, Ir, Co, Ti, TiN, TaN, LaNiO, Al, PtIrO$_x$, PtRhO$_x$, Rh/TaAlN. A metal film capable of achieving uniform orientation may also be interposed. A buffer layer, a barrier metal layer and an adhesive layer may further be interposed.

Available examples of the variable resistive element VR include: one that changes the resistance in accordance with a phase change between the crystalline state and the amorphous state, such as a chalcogenide (PCRAM); one that changes the resistance by precipitating metal cations to form a bridge (conducting bridge) between electrodes and ionizing the precipitated metal to destruct the bridge (CBRAM); and one that changes the resistance by applying a voltage or current (ReRAM) although there is no agreed theory (the factors in the resistance variation are roughly divided into two: one that causes a variation in resistance in accordance with the presence/absence of charge trapped in charge traps present in the electrode interface; and one that causes a variation in resistance in accordance with the presence/absence of the conduction path due to an oxygen loss and so forth).

Figure 4:
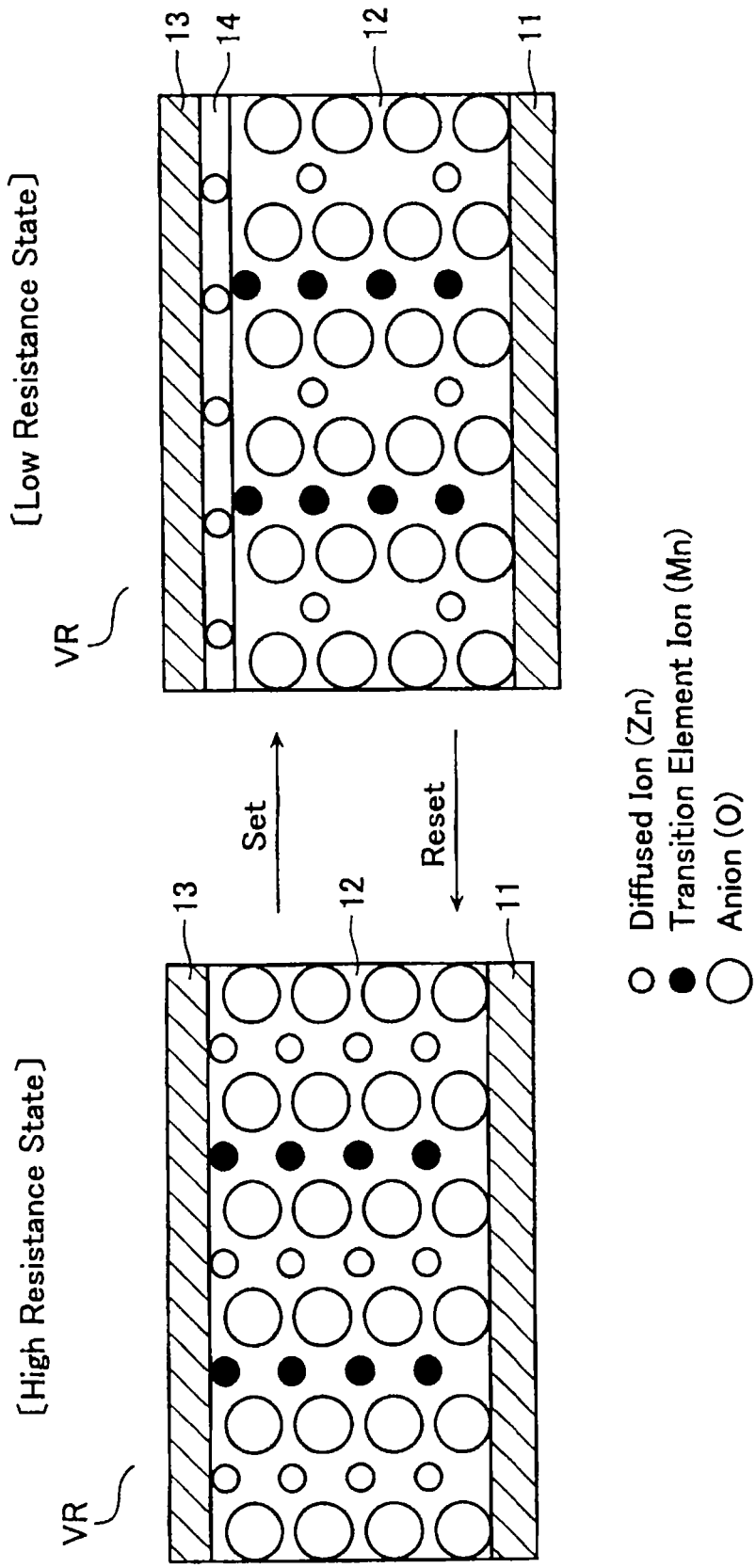
FIG. 4 is a schematic cross-sectional view showing an example of the variable resistive element in the same embodiment.

FIG. 4 shows an example of the ReRAM. The variable resistive element VR shown in FIG. 4 includes a recording layer 12 arranged between electrode layers 11, 13. The recording layer 12 is composed of a composite compound containing at least two types of cation elements. At least one of the cation elements is a transition element having the d-orbit incompletely filled with electrons, and the shortest distance between adjacent cation elements is 0.32 nm or lower. Specifically, it is represented by a chemical formula $A_xM_yX_z$ (A and M are different elements) and may be formed of material having a crystal structure such as a spinel structure ($AM_2O_4$), an ilmenite structure ($AMO_3$), a delafossite structure ($AMO_2$), a $LiMoN_2$ structure ($AMN_2$), a wolframite structure ($AMO_4$), an olivine structure ($A_2MO_4$), a hollandite structure ($A_xMO_2$), a ramsdellite structure ($A_xMO_2$), and a perovskite structure ($AMO_3$).

In the example of FIG. 4, A comprises Zn, M comprises Mn, and X comprises O. In the recording layer 12, a small white circle represents a diffused ion (Zn), a large white circle represents an anion (O), and a small black circle represents a transition element ion (Mn). The initial state of the recording layer 12 is the high-resistance state. When the electrode layer 11 is kept at a fixed potential and a negative voltage is applied to the electrode layer 13, part of diffused ions in the recording layer 12 migrate toward the electrode layer 13 to reduce diffused ions in the recording layer 12 relative to anions. The diffused ions arrived at the electrode layer 13 accept electrons from the electrode layer 13 and precipitate as a metal, thereby forming a metal layer 14. Inside the recording layer 12, anions become excessive and consequently increase the valence of the transition element ion in the recording layer 12. As a result, the carrier injection brings the recording layer 12 into electron conduction and thus completes setting. On regeneration, a current may be allowed to flow, of which value is very small so that the material configuring the recording layer 12 causes no resistance variation. The programmed state (low-resistance state) may be reset to the initial state (high-resistance state) by supplying a large current flow in the recording layer 12 for a sufficient time, which causes Joule heating to facilitate the oxidation reduction reaction in the recording layer 12. Application of an electric field in the opposite direction from that at the time of setting may also allow resetting.

The non-ohmic element NO may include various diodes such as a Schottky diode, a PN-junction diode, a PIN diode, and may have a MIM (Metal-Insulator-Metal) structure, and a SIS (Silicon-Insulator-Silicon) structure. In this case, electrodes EL2, EL3 forming a barrier metal layer and an adhesive layer may be interposed. If a diode is used, from the property thereof, it can perform the unipolar operation. In the case of the MIM structure or SIS structure, it can perform the bipolar operation. The non-ohmic element NO and the variable resistive element VR may be placed in the opposite relation to that in FIG. 3. The non-ohmic element NO may be reversed in polarity.

The following description is given on the assumption that the high-resistance state of the resistance states of the variable resistive element VR defines data "1" and the low-resistance state defines data "0". In addition, writing or setting may also be represented by "0" writing" while erasing or resetting may be represented by "1" writing" as well.

Figure 5:
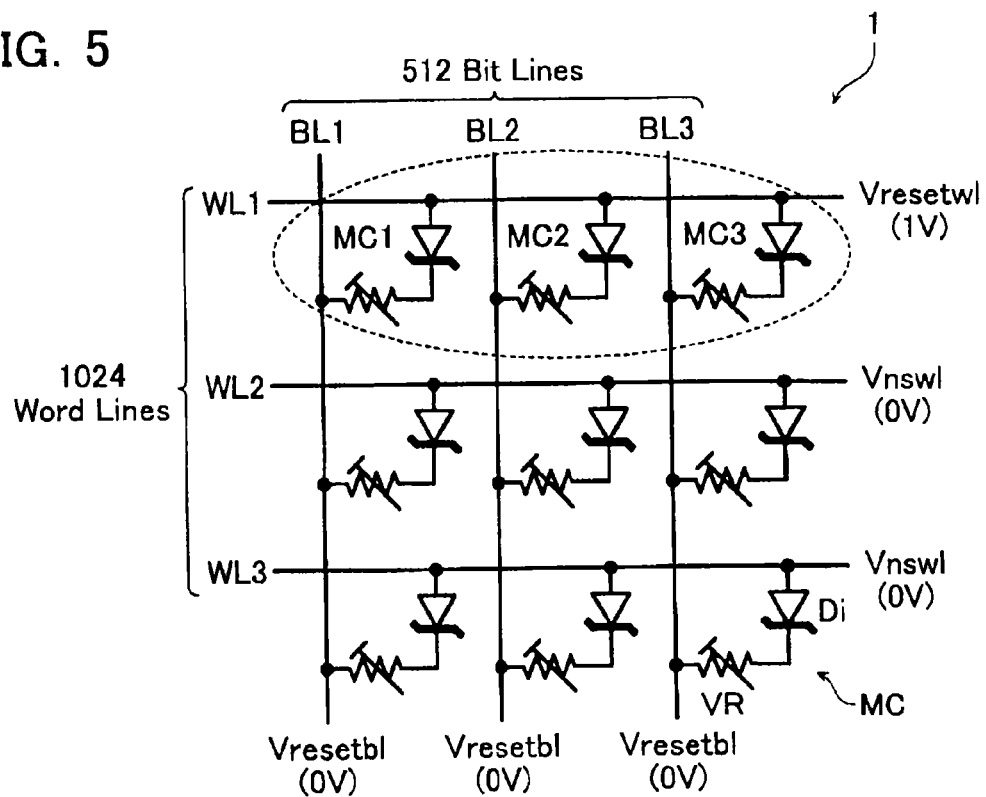
FIG. 5 is a diagram showing a circuit in the MAT and voltages supplied to lines at the time of "1" write in the same embodiment.
Figure 6:
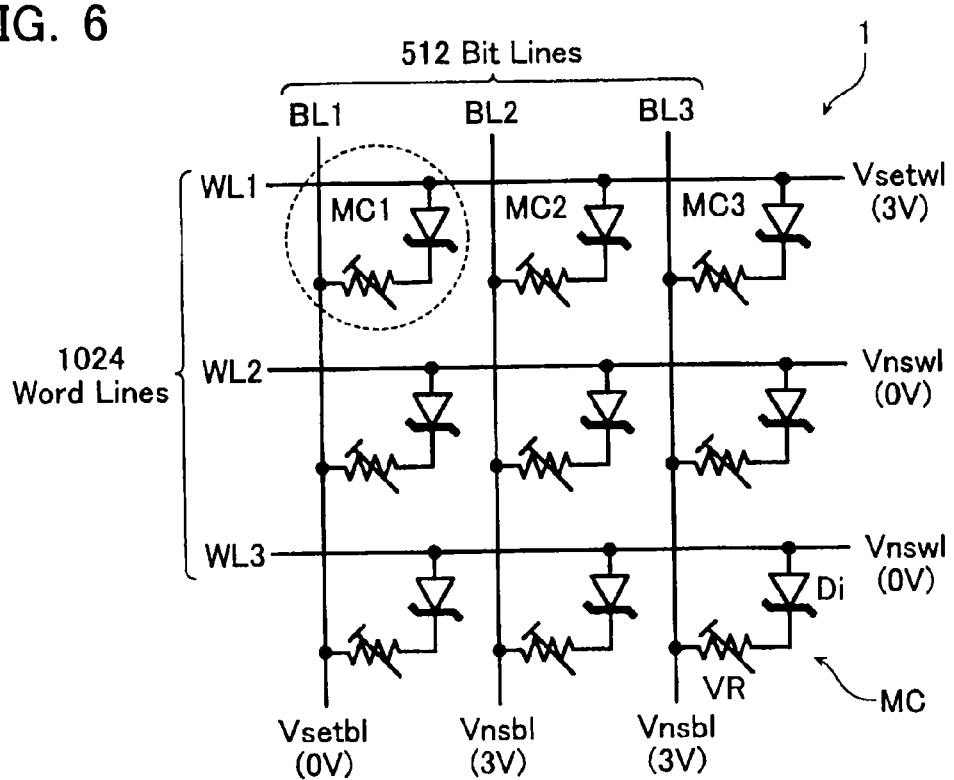
FIG. 6 is a diagram showing a circuit in the MAT and voltages supplied to lines at the time of "0" write in the same embodiment.

Data writing in the present embodiment is described next.
FIGS. 5 and 6 are circuit diagrams of the MAT 1.

The MAT 1 includes, for example, 1024 word lines WL and, for example, 512 bit lines BL crossing these word lines WL. There are 1024×512 intersections of the lines, at which connected are memory cells MC each including the non-ohmic element NO or a diode Di having an anode connected to the word line WL, and the variable resistive element VR connected between the cathode of the diode Di and the bit line BL. The size of the MAT 1 can be determined arbitrarily in consideration of voltage drops on the word line WL and the bit line BL, CR delays, processing speeds of data writing, and so forth. For example, other than the MAT 1 shown in FIG. 5, the MAT has an arbitrarily selected size such as 1024×2048.

With regard to the MAT 1 thus configured, a specific example is described on writing "0" to the memory cell MC1 and "1" to other memory cells MC.

First, as the method of writing data to such the MAT 1, a method is considered, which comprises once clearing (resetting) all memory cells MC in the MAT 1 to "1". This method has an advantage because it is sufficient to write only "0" input data without the need for considering data stored immediately before.

Resetting all memory cells MC in the MAT 1 is processed at a certain number of memory cells MC connected to one word line WL, in the case of FIG. 5, taking heat production from the MAT 1 into account. As a specific example, a method is described, which comprises clearing memory cells MC1-MC3 connected to a word line WL1, surrounded by the dotted line in FIG. 5, to "1".

In this case, the row control circuit 3 supplies a word line reset voltage Vresetwl (of 1 V, for example) to the word line WL1, and the column control circuit 3 supplies a bit line reset voltage Vresetbl (of 0 V, for example) to the bit lines BL1-BL3. As a result, in the memory cells MC1-MC3, the diode Di is forward biased and the variable resistive element VR makes a transition to the high-resistance state. On the other hand, the row control circuit 3 supplies a word line non-selection voltage Vnswl (of 0 V, for example) to the word lines WL2, WL3 connected to other memory cells MC. As a result, in the other memory cells MC, the diode Di is reverse biased and the variable resistive element VR makes no transition in the resistance state. Thus, the memory cells MC1-MC3 are cleared to "1". Through repetitions of the above over all the word lines WL, all the memory cells can be cleared to "1".

If it is not required to consider heat production from the memory cells MC at the time of reset, supplying a word line reset voltage Vresetwl (of 3 V, for example) to all the word lines WL makes it possible to reset the entire MAT 1 in batch. In this case, the length of time can be made shorter than when each word line WL is individually cleared to "1".

In the following description, a set of plural memory cells MC processed in batch, like the memory cells MC1-MC3 cited in the above specific example, may also be represented by a "page".

Next, "0" is written to the memory cell MC1.
In this case, the row control circuit 3 supplies a word line set voltage Vsetwl (of 3 V, for example) to the word line WL1, and the column control circuit 3 supplies a bit line set voltage Vsetbl (of 0 V, for example) to the bit line BL connected to the memory cell MC1. On the other hand, it supplies a word line non-selection voltage Vnswl (of 0 V, for example) and a bit line non-selection voltage Vnsbl (of 3 V, for example) to the word lines WL and bit lines BL connected to other memory cells MC, respectively. As a result, in the memory cell MC1, the diode Di is forward biased and the variable resistive element VR makes a transition to the low-resistance state. On the other hand, in the other memory cells MC, the diode Di is reverse biased and the variable resistive element VR makes no transition in the resistance state, thereby writing "0" only to the memory cell MC1.

Thus, "0" can be written to the memory cell MC1 and "0" to the other memory cells MC.

This method, however, requires once clearing all the memory cells MC with "1", which extends the processing time correspondingly as a problem. In this data writing method, the memory cells MC contained in one page are arranged closely. Accordingly, heat production from one of the diode Di and the variable resistive element VR in each memory cell MC mutually influences on the other and becomes a factor that makes the operation unstable.

Figure 7:
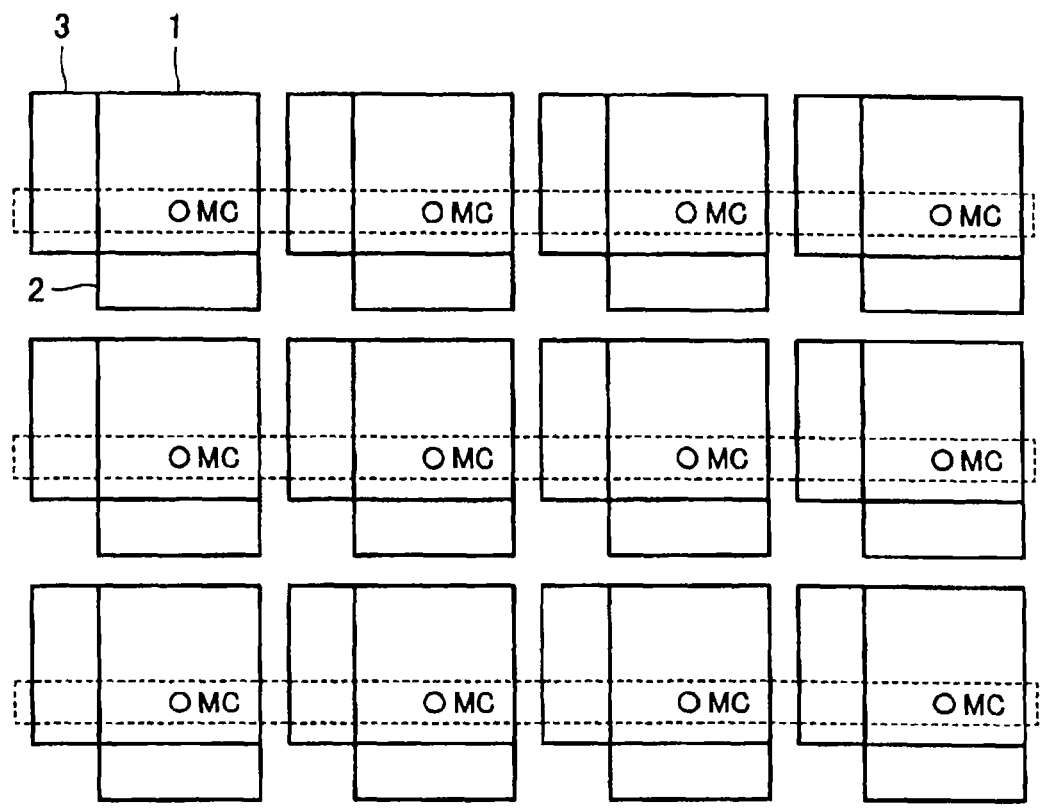
FIG. 7 is a brief view showing a page configuration in a cell array in the same embodiment.

Therefore, the present embodiment selects one memory cell MC from each MAT 1 and writes data "0" or "1" to the memory cells MC contained in a page surrounded by the dotted line in the figure at the same time as shown in FIG. 7.

Thus, the length of time required for data write processing can be made shorter than the cases in FIGS. 5 and 6 because no reset is required prior to data write. Further, plural memory cells MC contained in a page are arranged separately from each other and accordingly the influence by heat production from the memory cells MC can be relieved at the time of data writing.

Figure 8:
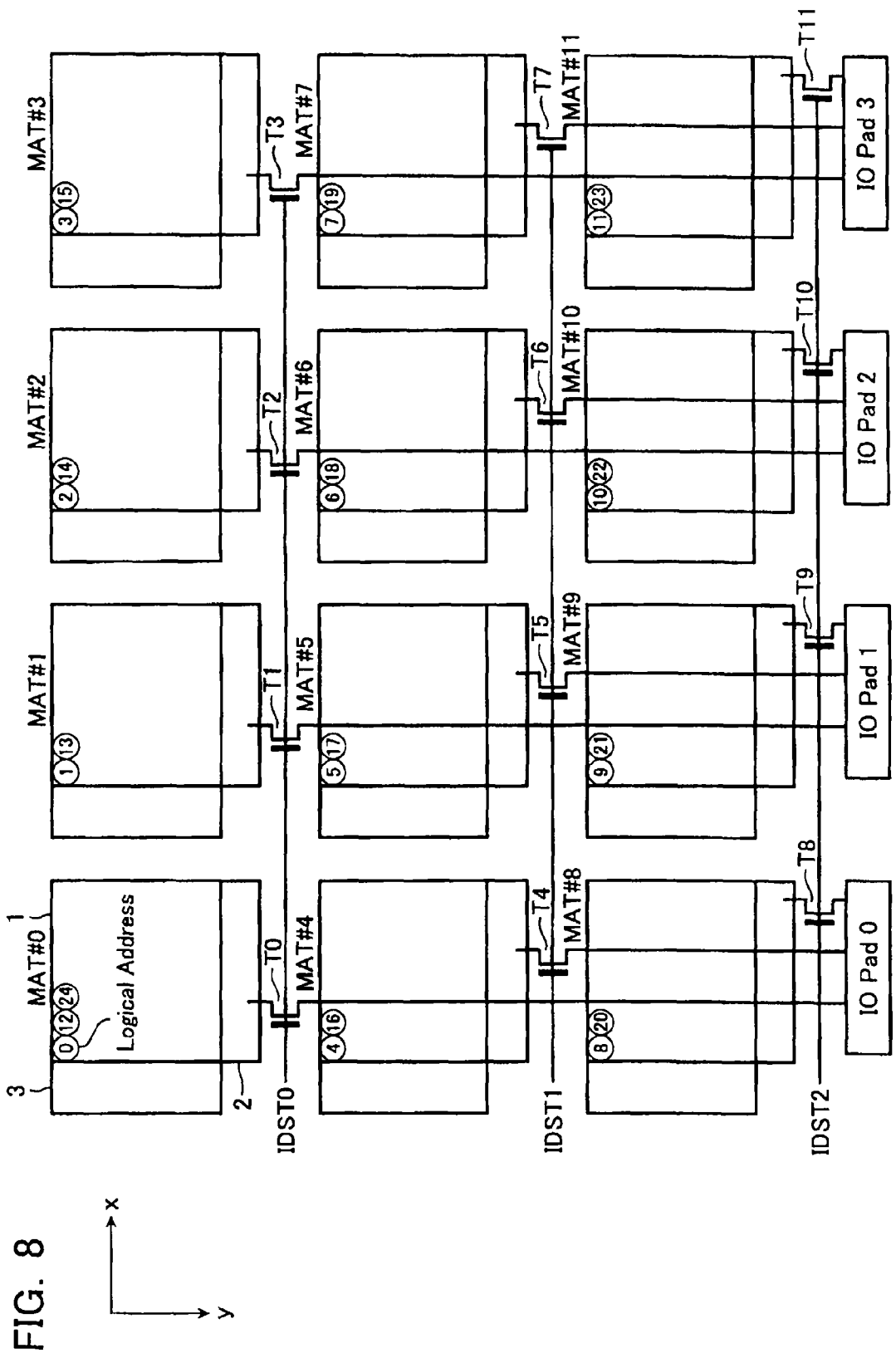
FIG. 8 is a block diagram of the cell array in the same embodiment.

FIG. 8 is a block diagram of the cell array in the present embodiment, in which a reference numeral surrounded by a blank circle denotes a logical address assigned to each memory cell MC.

The cell array in FIG. 8 is divided into 4 rows in the x direction along which the word line WL extends and 3 columns in the y direction along which the bit line BL extends, and thus 12 MATs 1 in total. The following description is given on the assumption that the MATs 1 located on the upper stage in FIG. 8 are denoted with MATs #0, #1, #2, #3 from the left, the MATs 1 located on the middle stage with MATs #4, #5, #6, #7 from the left, and the MATs 1 located on the lower stage with MATs #8, #9, #10, #11. Each MAT 1 is provided with a column control circuit 2 and a row control circuit 3. Such column control circuits 2 and row control circuits 3 are supplied with various voltages required for data write/read from the pulse generator 8 shown in FIG. 1.

The column control circuits 2 in the MATs #0, #4, #8 aligned in the y direction are connected via transfer transistors T0, T4, T8 to an IO pad 0. Similarly, the column control circuits 2 in the MATs #1, #5, #9 are connected via transfer transistors T1, T5, T9 to an IO pad 1, the column control circuits 2 in the MATs #2, #6, #10 are connected via transfer transistors T2, T6, T10 to an IO pad 2, and the column control circuits 2 in the MATs #3, #7, #11 are connected via transfer transistors T3, T7, T11 to an IO pad 3, respectively.

The transfer transistors T0-T3 aligned in the x direction have respective gates, which are supplied with a common input data selection signal IDST0. Similarly, the transfer transistors T4-T7 and T8-T11 have respective gates, which are supplied with common input data selection signals IDST1 and IDST2, respectively. The input data selection signals IDST0-2 are signals determined on the basis of input addresses.

Figure 9:
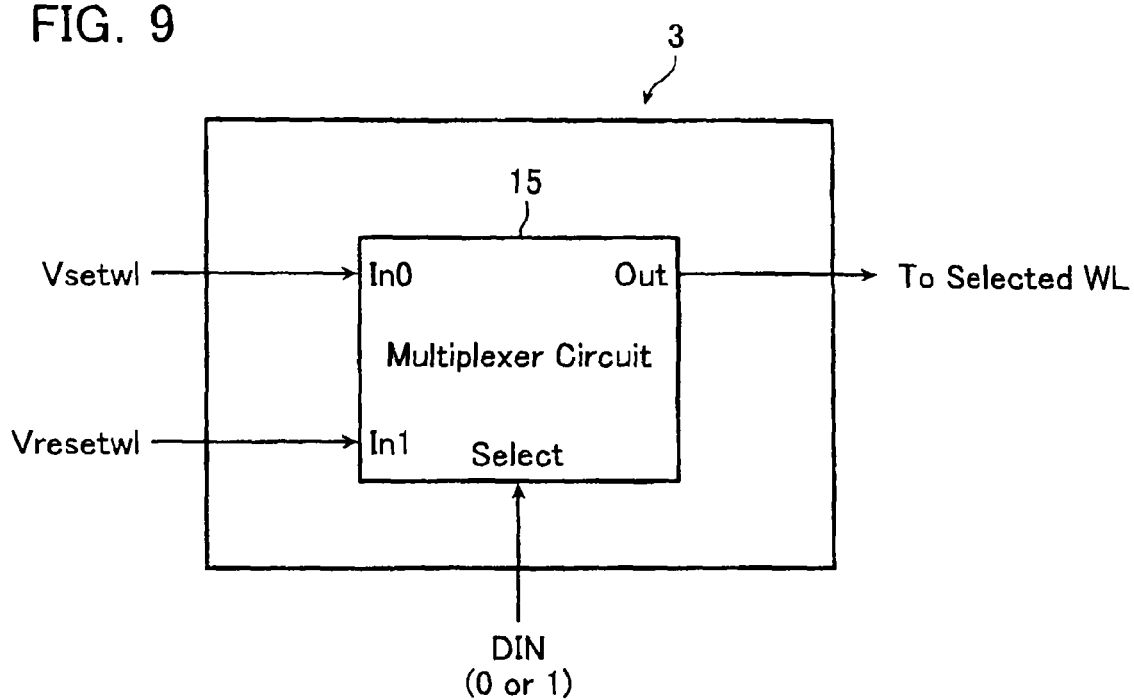
FIG. 9 is a block diagram showing part of the function of a row control circuit in the same embodiment.

Further, the row control circuit 3 in each MAT 1 includes a multiplexer circuit 15, that is, the selection circuit shown in FIG. 9. The multiplexer circuit 15 is operative to select one of the word line set voltage Vsetwl and the word line reset voltage Vresetwl fed from the pulse generator 8 to the row control circuit 3 and supply the selected one to a selected word line WL. The supply of either voltage is determined by input data DIN. Specifically, the word line set voltage Vsetwl is supplied to the selected word line WL if the input data is "0" while the word line reset voltage Vresetwl to the selected word line WL if the input data is "1".

The column control circuit 2 in each MAT 1 includes a similar circuit to that in FIG. 9. The multiplexer circuit contained in the column control circuit 2 is operative to select one of the bit line set voltage Vsetbl and the bit line reset voltage Vresetbl fed from the pulse generator 8 to the column control circuit 2 and supply the selected one to the selected word line WL.

The following description is given to assignment of logical addresses to the memory cells MC contained in the cell array.

A logical address i is assigned to a memory cell MC, which adjacently locates on the right of a memory cell MC at a logical address i—12 and below a memory cell MC at i—6144 (in the case of 512 bit lines BL). A memory cell MC locating at the upper left corner in a MATm is assigned with a logical address m. In the MAT #2, for example, memory cells MC locating at the upper left corner, the upper right corner, the lower left corner, and the lower right corner are assigned with logical addresses #2, #6134, #6285314, and #6291446, respectively (in the case of 1024 word lines WL and 512 bit lines BL).

There are 12 MATs and one memory cell MC is selected from every MAT 1 so that memory cells MC contained in one page are 12 in number. Therefore, a j-th page contains memory cells MC at logical addresses 12×(j−1) through 12×(j−1)+11. For example, the second page contains 12 memory cells MC at logical addresses #12-#23.

In general, in the case where the number of MATs is Nm (Nm=an integer of 1 or more), the number of word lines WL in each MAT is Na (Na=an integer of 1 or more), and the number of bit lines BL is Nb (Nb=an integer of 1 or more), a memory cell connected to an a-th word line WL (a=an integer of 1 to Na) and a b-th bit line BL (b=an integer of 1 to Nb) has a logical address i, which can be represented by $\{(a-1)Nb+(b-1)\}Nm+(m-1)$. In this case, a j-th page (j=an integer of 1 to Na×Nb) is composed of Nm memory cells at logical addresses Nm(j−1) through Nm(j−1)+(Nm−1).

Writing data to such the cell array is described next.

Initially, input data fed from external is transferred to the column control circuit 2 contained in each MAT 1 via the IO pad. The configuration of FIG. 8 includes 4 IO pads. Accordingly, when input data is transferred to the column control circuits 2 contained in all the 12 MATs 1, the input data is divided into 3 pieces and these are transferred at different times. Specifically, first 4 bits of the input data are prepared on the IO pads 0-3. Thereafter, the input data selection signal IDST0 is activated ("H") to turn on the transfer transistors T0-T3 to connect the IO pads 0-3 with the column control circuits 2 in the MATs #0-#3. Thus, the input data bits on the IO pads 0-3 are transferred to the column control circuits 2 in the MATs #0-#3. Subsequently, next 4 bits of the input data are prepared on the 10 pads 0-3. Thereafter, the input data selection signal IDST1 is activated ("H") to turn on the transfer transistors T4-T7 to connect the IO pads 0-3 with the column control circuits 2 in the MATs #4-#7. Thus, the input data bits on the IO pads 0-3 are transferred to the column control circuits 2 in the MATs #4-#7. Similarly, subsequent 4 bits of the input data are transferred to the column control circuits 2 in the MATs #8-#11. Thus, one bit of the input data can be prepared in the column control circuits 2 in all the MATs 1. The input data selection signals IDST0-2 are herein controlled such that they are activated sequentially at operation cycles.

In this state, data is written in selected memory cells MC in the MATs.

Subsequently, data writing in the MATs 1 is described.

A first description is given to the case where input data is "0". The voltages supplied to the word lines WL and the bit lines BL in the MAT 1 in this case are similar to those of FIG. 6.

The word line WL1 and the bit line BL1 connected to the memory cell MC1 are supplied with the word line set voltage Vsetwl (of 3 V, for example) from the row control circuit 2 and the bit line set voltage Vsetbl (of 0 V, for example) from the column control circuit 3, respectively. As a result, the diode Di in the memory cell MC1 is forward biased and the variable resistive element VR, if it is in the low-resistance state, still remains the low-resistance state while the variable resistive element VR, if it is in the high-resistance state, makes a transition to the low-resistance state. On the other hand, the word lines WL and the bit lines BL connected to other memory cell MC are supplied with the word line non-selection voltage Vnswl (of 0 V, for example) from the row control circuit 3 and the bit line non-selection voltage Vnsbl (of 3 V, for example) from the column control circuit 2, respectively. As a result, the diode Di in the memory cell MC is reverse biased and the variable resistive element VR makes no transition in the resistance state. Thus, "0" is written only in the memory cell MC1.

Figure 10:
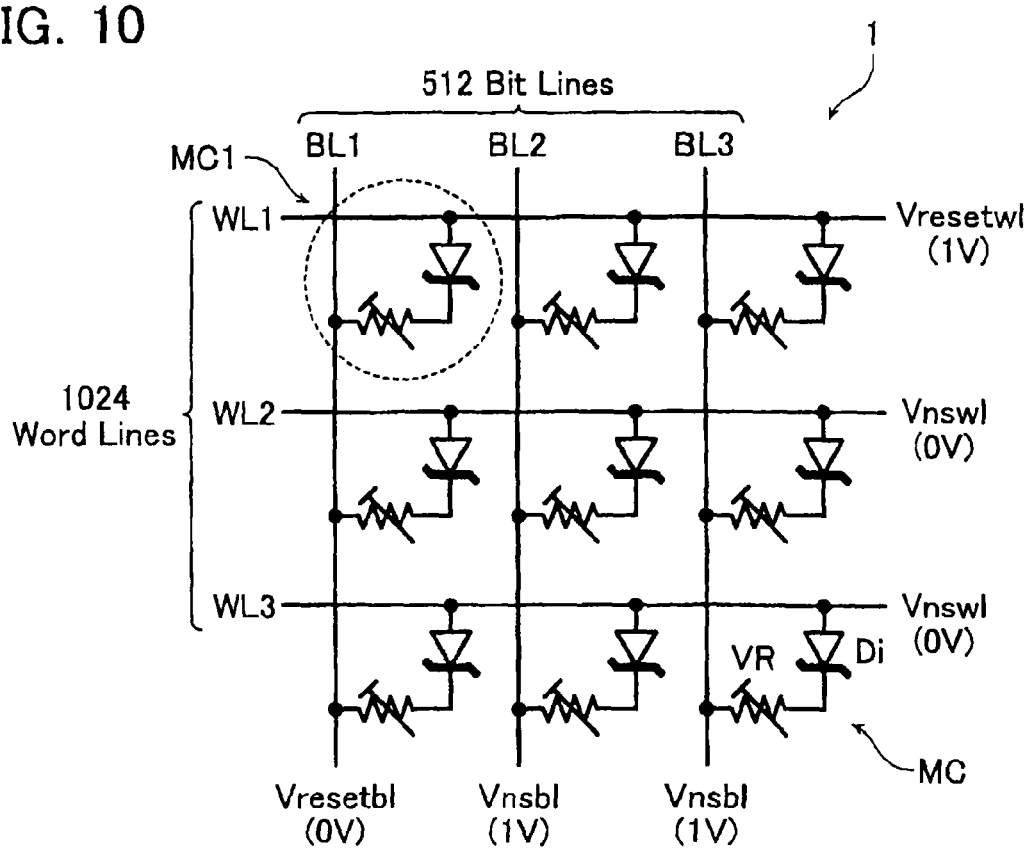
FIG. 10 is a diagram showing a circuit in the MAT and voltages supplied to lines at the time of "1" write in the same embodiment.

The following description using FIG. 10 is given to the case where input data is "1".

The word line WL1 and the bit line BL1 connected to the memory cell MC1 are supplied with the word line reset voltage Vresetwl (of 1 V, for example) from the row control circuit 2 and the bit line reset voltage Vresetbl (of 0 V, for example) from the column control circuit 3, respectively. As a result, the diode Di in the memory cell MC1 is forward biased and the variable resistive element VR, if it is in the high-resistance state, still remains the high-resistance state while the variable resistive element VR, if it is in the low-resistance state, makes a transition to the high-resistance state. On the other hand, the word lines WL and the bit lines BL connected to other memory cell MC are supplied with the word line non-selection voltage Vnswl (of 0 V, for example) from the row control circuit 3 and the bit line non-selection voltage Vnsbl (of 1 V, for example) from the column control circuit 2, respectively. As a result, the diode Di in the memory cell MC1 is reverse biased and the variable resistive element VR makes no transition in the resistance state. Thus, "1" is written only in the memory cell MC1.

The above data write can be executed over the MAT #0 through MAT #11 in batch to complete data write in one page. Further, this processing can be repeated over all pages to complete data write in the entire cell array.

The following description is given to a control method in the case where the lengths of time of supplying voltages to the word line WL and the bit line BL at the time of "1" write are different from those at the time of "0" write.

Figure 11A:
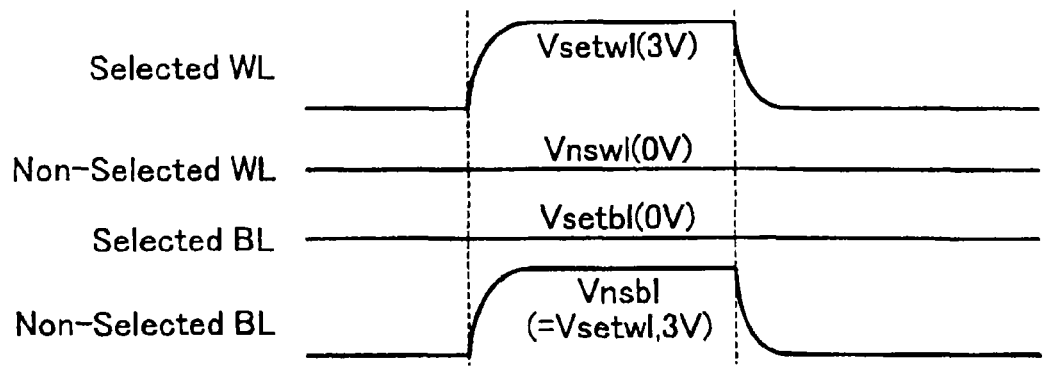
FIG. 11A shows a diagram of operating waveforms in each MAT at the time of "0" write in the same embodiment.
Figure 11B:
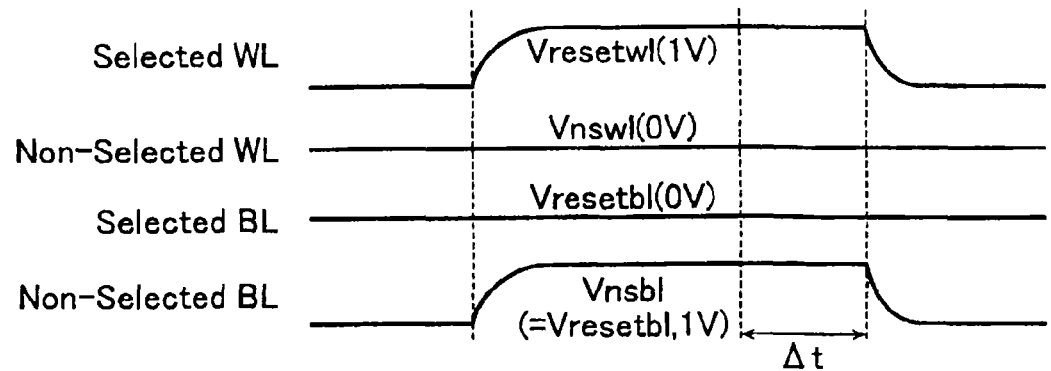
FIG. 11B shows a diagram of operating waveforms in each MAT at the time of "1" write in the same embodiment.

FIG. 11 shows operating waveforms in each MAT in this case; FIGS. 11A and 11B relate to the cases of input data "0" and "1", respectively.

In the example of FIG. 11, compared with the length of time of supplying the word line set voltage Vsetwl to the selected word line WL at the time of "0" write, the length of time of supplying the word line reset voltage Vresetwl to the selected word line WL at the time of "1" write is longer by Δt for the following reason. Namely, in resetting, a current flow is supplied in the variable resistive element VR for a loner time to facilitate the oxidation reduction reaction by Joule heating as described above.

Figure 12:
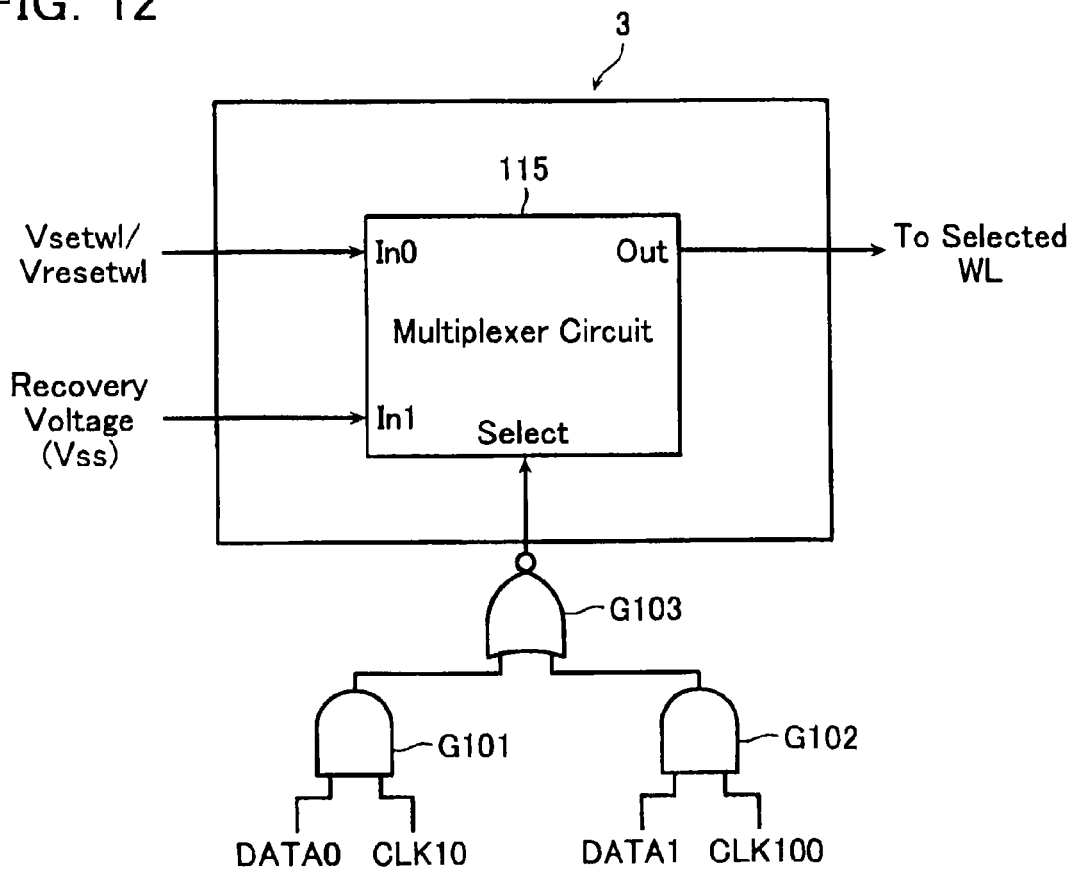
FIG. 12 is a block diagram showing part of the function of the row control circuit in the same embodiment.

In this case, a further multiplexer circuit 115 shown in FIG. 12 is added at the rear stage of the multiplexer circuit 15.

The multiplexer circuit 115 is operative to select one of the word line set voltage Vsetwl or the word line reset voltage Vresetwl fed from the multiplexer circuit 15 and a recovery voltage (of 0 V, for example) and supply the selected one to the word line WL. The recovery voltage is a voltage supplied to the word line WL at the normal time after the word line set voltage Vsetwl or the word line reset voltage Vresetwl is supplied for a certain time. The multiplexer circuit 115 is controlled by the output from a NOR gate G103, which receives the output from an AND circuit G101 and the output from an AND circuit G102. The AND circuit G101 receives a data identification signal DATA0 that is made active ("H") in the case of input data "0", and a clock count signal CLK10 that is made active ("H") during the period of 10 clocks given from the controller 7 shown in FIG. 1. The AND circuit G102 receives a data identification signal DATA1 that is made active ("H") in the case of input data "1", and a clock count signal CLK100 that is made active ("H") during the period of 100 clocks given from the controller 7 shown in FIG. 1. The clock count signal is a signal determined by the lengths of time of supplying the word line set voltage Vsetwl and the word line reset voltage Vresetwl to the word line WL and the bit line BL at the time of "0" and "1" write and the period of the clock given from the state machine. In the example shown in FIG. 12, if the clock period is 10 ns, the length of time of supplying the word line set voltage Vsetwl at the time of "0" write and the length of time of supplying the word line reset voltage Vresetwl at the time of "1" write are 100 ns and 1 μs, respectively. These lengths of supply time can be adjusted with the active period of time in the clock count signal.

Subsequently, operation of the multiplexer circuit 115 is described.

In the case of input data "0", the input In0 of the multiplexer circuit 115 in FIG. 9 is supplied with the word line set voltage Vsetwl from the multiplexer circuit 15. In addition, the data identification signal DATA0 and the clock count signals CLK10, CLK100 become "H" (active) and the data identification signal DATA1 becomes "L". In this case, the output from the AND gate G101 becomes "H" and the output from the NOR gate G103 becomes "L". As a result, the selected word line WL is supplied with the word line set voltage Vsetwl. Thereafter, when 10 pulses are supplied from the state machine, the clock count signal CLK10 becomes "L". Therefore, the output from the AND gate G101 becomes "L" and the output from the NOR gate G103 becomes "H". As a result, the selected word line WL is supplied with the recovery voltage.

In the case of input data "1", the input In0 of the multiplexer circuit 115 is supplied with the word line reset voltage Vresetwl. In addition, the data identification signal DATA1 and the clock count signals CLK10, CLK100 become "H" (active) and the data identification signal DATA1 becomes "L". In this case, the output from the AND gate G102 becomes "H" and the output from the NOR gate G103 becomes "L". As a result, the selected word line WL is supplied with the word line reset voltage Vresetwl. Thereafter, when 100 pulses are supplied from the state machine, the clock count signal CLK100 becomes "L". Therefore, the output from the AND gate G101 becomes "L" and the output from the NOR gate G103 becomes "H". As a result, the selected word line WL is supplied with the recovery voltage.

The column control circuit 2 also includes a similar circuit to the circuit shown in FIG. 12. In the case of the multiplexer circuit in the column control circuit 2, the input In0 is supplied with the bit line set voltage Vsetbl (of 0 V, for example) or the bit line reset voltage Vresetbl (of 0 V, for example) in accordance with input data.

Thus, data can be written in the memory cell MC connected to the selected word line WL and the selected bit line BL. This data write can be executed over all the MAT 1 at the same time to complete data write in one page.

In the case of the above embodiment, "0" write takes 100 ns and "1" write takes 1 μs. Therefore, the time required for data write in one page is 1 μs, which can be made shorter by a processing time of 100 ns than those in the cases shown in FIGS. 5 and 6.

Verifying at the time of data write is described next. An addition of verifying to the above writing makes it possible to surely write data.

For example, if input data to a certain MAT 1 is "1", then "1" is written to a selected memory cell MC in the MAT 1, like in the above case. Thereafter, the hold data in the selected memory cell MC is read out to confirm whether or not the selected memory cell MC makes a transition to the high-resistance state. If the selected memory cell MC is in the high-resistance state, "1" write has been completed normally. Therefore, the write processing to the memory cell MC of question is terminated. On the other hand, if the selected memory cell MC has made no transition to the high-resistance state, 1" writing and verifying are repeated until the resistance state of the selected memory cell MC makes a transition to the high-resistance state.

Also in the case of input data "0", similarly, "0" writing and verifying are repeated until the selected memory cell MC makes a transition to the low-resistance state.

In accordance with the present embodiment, compared with the data writing method, which comprises resetting memory cells MC uniformly prior to "0" writing, the length of time required for data write processing can be reduced.

In addition, the memory cells MC contained in one page are spaced from each other and accordingly the influence by heat production from the memory cells MC can be relieved at the time of data writing.

Further, adjusting the length of voltage supply time at the time of data writing by the multiplexer circuit 115 shown in FIG. 12 or verifying within data write processing makes it possible to realize more stable data write processing.

Second Embodiment

The first embodiment accompanies data writing once at least regardless of the hold data in the selected memory cell MC. Therefore, even if the hold data is "0", further "0" write is executed. In this case, the variable resistive element VR in the memory cell MC is in the low-resistance state. Accordingly, large current flows therein and may destruct the memory cell MC and so forth possibly.

Figure 13:
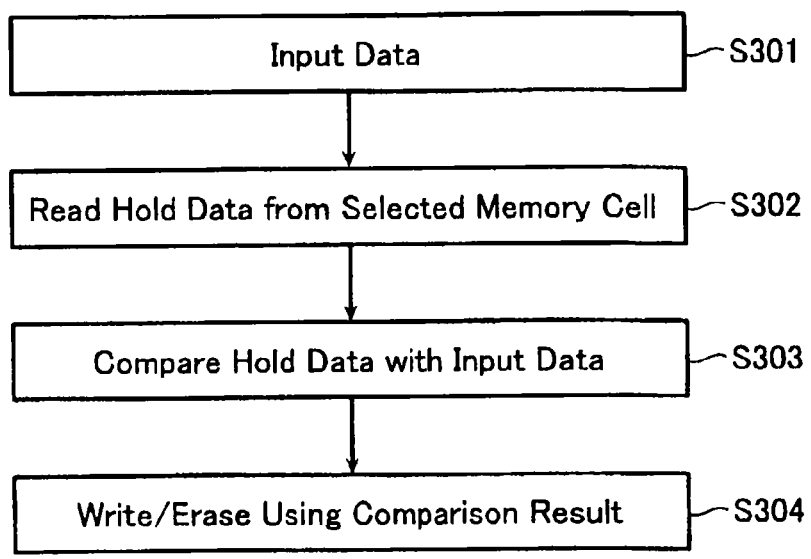
FIG. 13 is a flowchart showing data write processing in a nonvolatile memory according to a second embodiment of the present invention.

Therefore, in the nonvolatile memory according to the second embodiment, data write processing is executed in accordance with a certain procedure shown in FIG. 13.

First, after input data is transferred to the column control circuit 2 in each MAT 1 (S301), hold data is previously read out of the selected memory cell MC before first writing data (S302).

Next, the read-out hold data is compared with the input data (S303) and, if the result indicates a coincident, the flow terminates without writing data. On the other hand, if the result indicates no coincident, data writing and verifying are repeated until the result indicates a coincident (S304).

The above operation can be executed over all the MATs 1 to complete data write in one page.

The present embodiment comprises no data writing when the input data and the hold data in the selected memory cell MC are both "0". Therefore, it is possible to avoid the destruction of the memory cell MC and so forth due to large current caused at that time.

Third Embodiment

The second embodiment comprises no data writing when the input data and the hold data in the selected memory cell MC are both "0". If the resistance state of the variable resistive element VR used in the memory cell MC is in the low-resistance state, however, application of thermal energy higher than the barrier potential makes a transition to a thermally stable state at a lower electrochemical potential, that is, the high-resistance state as the property. Therefore, even if the hold data in the memory cell MC is "0", it may be intended to positively overwrite "0" depending on the case to suppress the transition to the high-resistance state.

The following description is therefore given to such a nonvolatile memory that writes "0" and suppresses occurrences of large current at the same time even if the input data and the hold data in the selected memory cell MC are both "0".

Figure 14:
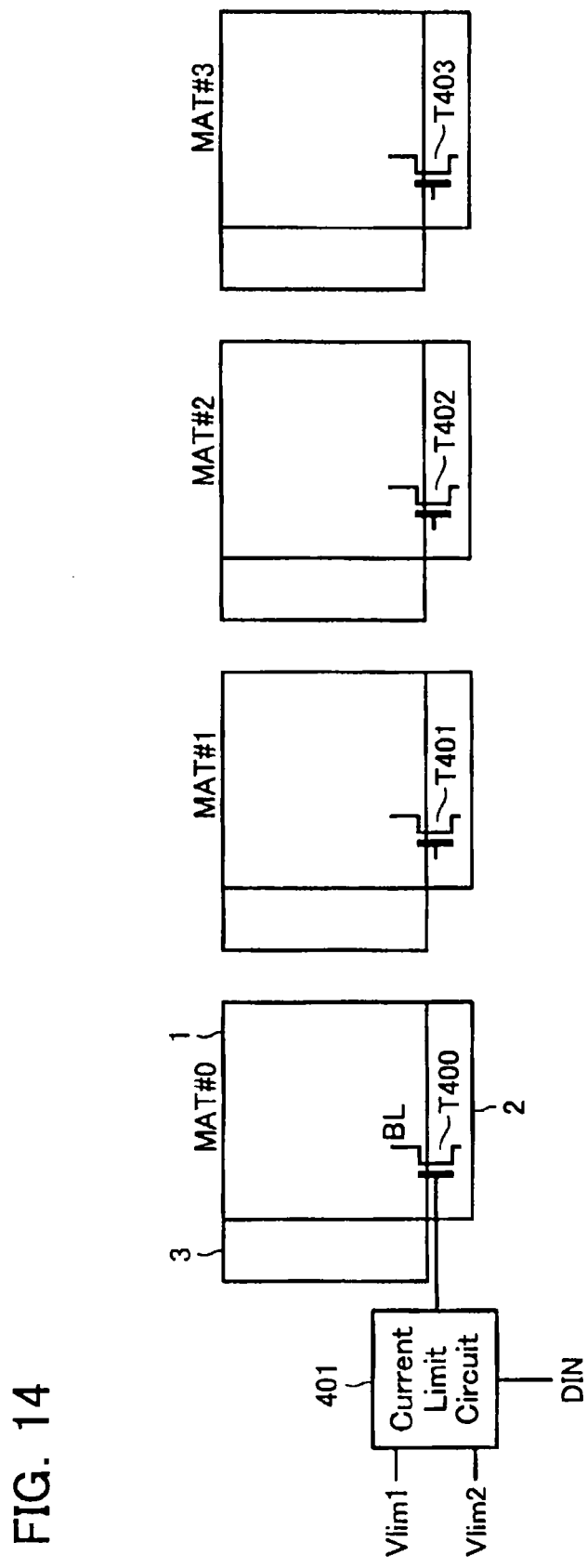
FIG. 14 is a block diagram showing part of a cell array in a nonvolatile memory according to a third embodiment of the present invention.

FIG. 14 is a block diagram showing part of a cell array in a nonvolatile memory according to a third embodiment of the present invention.

This nonvolatile memory comprises a current limit function added to the lines in the nonvolatile memories of the first and second embodiments.

There are plural transfer transistors T401, T402, ... provided between the bit line BL and the column control circuit 3 in the MATs, of which gates are connected to the output of a current limit circuit 401. The transfer transistors T401, T402, ... are operative to limit the current flowing in the bit line BL and the limit value is controlled by the current limit circuit 401.

The current limit circuit 401 is a circuit operative to selectively apply a limit voltage Vlim1 or Vlim2 to the transfer transistors T401, T402, ... as a gate voltage. The limit voltage Vlim1 is a voltage, which is selected at the time of normal data writing in which the variable resistive element VR in the selected memory cell MC makes a transition in the resistance state, and which is a gate voltage for limiting larger current than the current flowing in the bit line BL at the time of data writing. On the other hand, the limit voltage Vlim2 is a voltage, which is selected when the hold data in the selected memory cell MC and the input data DIN are both "0", and which is a much lower level gate voltage than the limit voltage Vlim1 to prevent a flow of large current. If the hold data in the selected memory cell MC and the input data DIN are both "1", the variable resistive element VR in the memory cell MC is kept in the high-resistance state. Accordingly, there is no need for imposing a current limitation.

In accordance with the present embodiment, even if the input data DIN and the hold data in the selected memory cell MC are both "0", it is possible to write "0" in the selected memory cell MC without a flow of large current. Further, in accordance with the relation between the input data DIN and the hold data in the selected memory cell MC, it is possible to appropriately impose a current limitation and accordingly reduce power consumption together.

Fourth Embodiment

In the first through third embodiments, the diode Di is used as the non-ohmic element NO in the memory cell MC and accordingly it can perform the unipolar operation that allows current to flow only from the word line WL toward the bit line BL. These embodiments are, though, also applicable to nonvolatile memories that perform the bipolar operation.

Figure 15A:
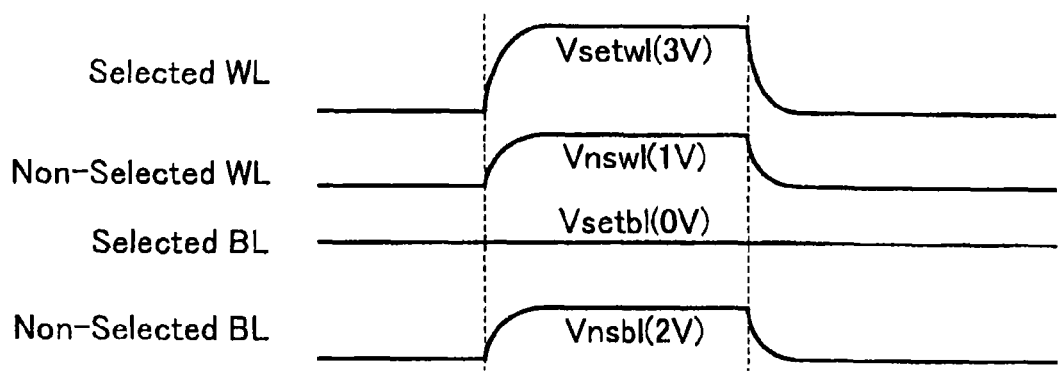
FIG. 15A shows a diagram of operating waveforms in each MAT at the time of "0" write in a nonvolatile memory according to a fourth embodiment of the present invention.
Figure 15B:
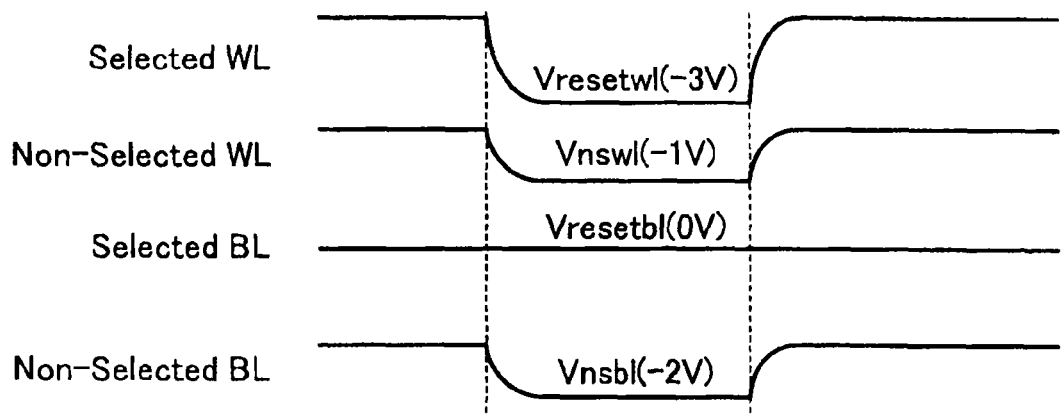
FIG. 15B shows a diagram of operating waveforms in each MAT at the time of "1" write in the same embodiment.
Figure 16A:
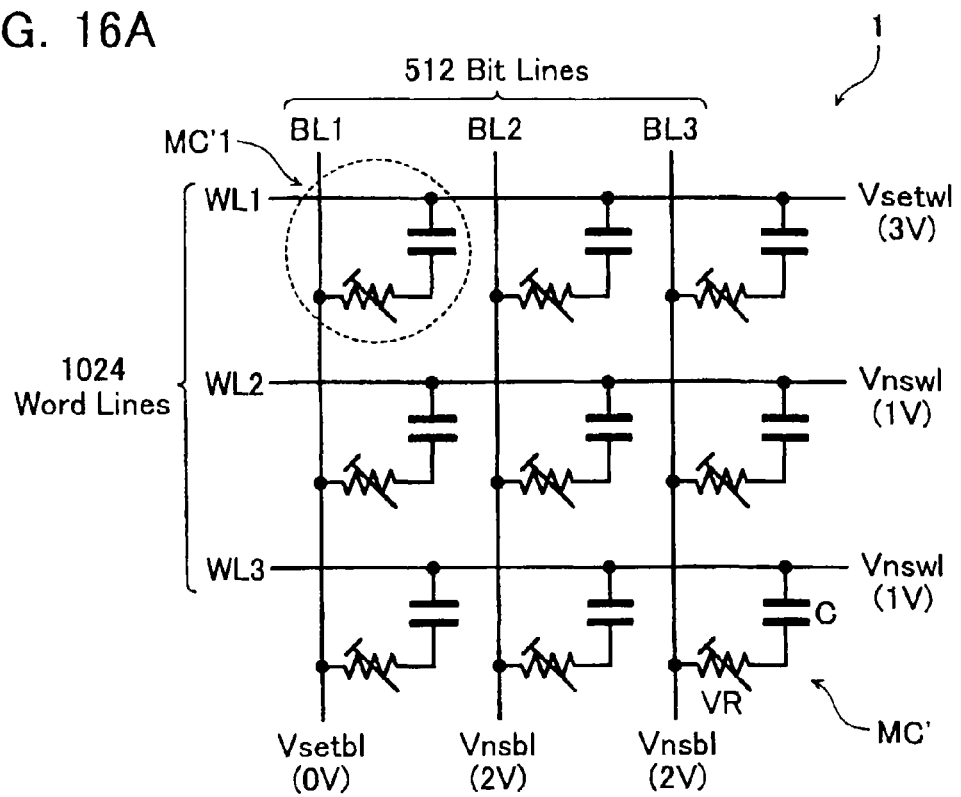
FIG. 16A is a diagram showing a circuit in the MAT and voltages supplied to lines at the time of "0" write in the same embodiment.
Figure 16B:
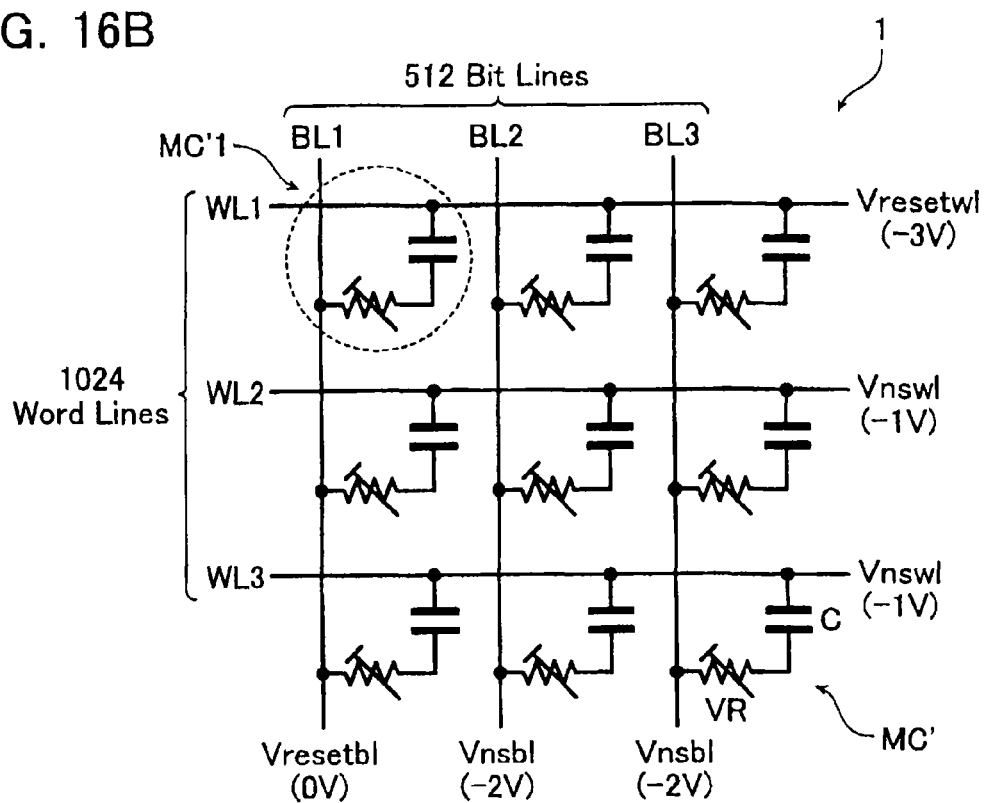
FIG. 16B is a diagram showing a circuit in the MAT and voltages supplied to lines at the time of "1" write in the same embodiment.

FIGS. 15A and 15B are diagrams of operating waveforms in each MAT 1 at the time of "0" write and at the time of "1" write in a nonvolatile memory according to a fourth embodiment of the present invention. FIGS. 16A and 16B are diagrams showing circuits in the MAT 1 and voltages supplied to the word line WL and the bit line BL at the time of "0" write and at the time of "1" write in the same embodiment.

A memory cell MC' includes a capacitor C used as the non-ohmic element NO. Available examples of the capacitor C include an MIM capacitor and an SIS capacitor.

When "0" is written in a memory cell MC'1 surrounded by the dotted line in FIG. 16A, a word line WL1 and a bit line BL1 connected to the memory cell MC'1 are supplied with a word line set voltage Vsetwl (of 3 V, for example) and a bit line set voltage Vsetbl (of 0 V, for example), respectively. In this case, the word line set voltage Vsetwl and the bit line set voltage Vsetbl are set to have a potential difference required for changing the variable resistive element VR to the low-resistance state. On the other hand, word lines WL and bit lines BL connected to other memory cells MC' are supplied with a word line non-selection voltage Vnswl (of 1 V, for example) and a bit line non-selection voltage Vnsbl (of 2 V, for example), respectively. In this case, in relations with both the bit line set voltage Vsetbl and the bit line non-selection voltage Vnsbl, the word line non-selection voltage Vnswl is set to have a potential difference of such the extent that the variable resistive element VR in the memory cell MC' makes no transition in the resistance state. Similarly, in relations with both the word line set voltage Vsetwl and the word line non-selection voltage Vnswl, the bit line non-selection voltage Vnsbl is set to have a potential difference of such the extent that the variable resistive element VR in the memory cell MC' makes no transition in the resistance state. As a result, the selected memory cell MC'1 makes a transition to the low-resistance state while other memory cells MC make no transition in the resistance state. Thus, "0" can be written in only the memory cell MC'1.

When "1" is written in the memory cell MC'1 surrounded by the dotted line in FIG. 16B, the word line WL1 and the bit line BL1 connected to the memory cell MC'1 are supplied with a word line reset voltage Vresetwl (of −3 V, for example) and a bit line reset voltage Vresetbl (of 0 V, for example), respectively. In this case, the word line reset voltage Vresetwl and the bit line reset voltage Vresetbl are set to have a potential difference required for changing the variable resistive element VR to the high-resistance state. On the other hand, word lines WL and bit lines BL connected to other memory cells MC' are supplied with a word line non-selection voltage Vnswl (of −1V, for example) and a bit line non-selection voltage Vnsbl (of −2 V, for example), respectively. In this case, the word line non-selection voltage Vnswl and the bit line non-selection voltage are similarly set as is at the time of "0" write. As a result, the selected memory cell MC'1 makes a transition to the high-resistance state while other memory cells MC make no transition in the resistance state. Thus, "1" can be written in only the memory cell MC'1.

The present embodiment also exerts the same effects as those in the first through third embodiments. Further, the voltage of the opposite polarity to that in "0" writing is supplied to the variable resistive element VR in the memory cell MC' for "1" writing. Therefore, it is possible to execute "1" writing in a similar length of time to that for "0" writing. Therefore, compared with the data write processing with the unipolar operation in the first through third embodiments, much faster data write processing can be executed.

Fifth Embodiment

Figure 17A:
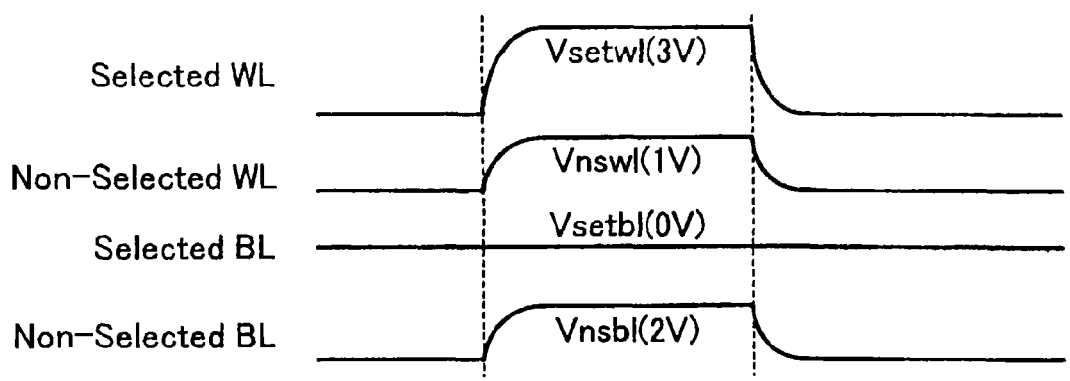
FIG. 17A shows a diagram of operating waveforms in each MAT at the time of "0" write in a nonvolatile memory according to a fifth embodiment of the present invention.
Figure 17B:
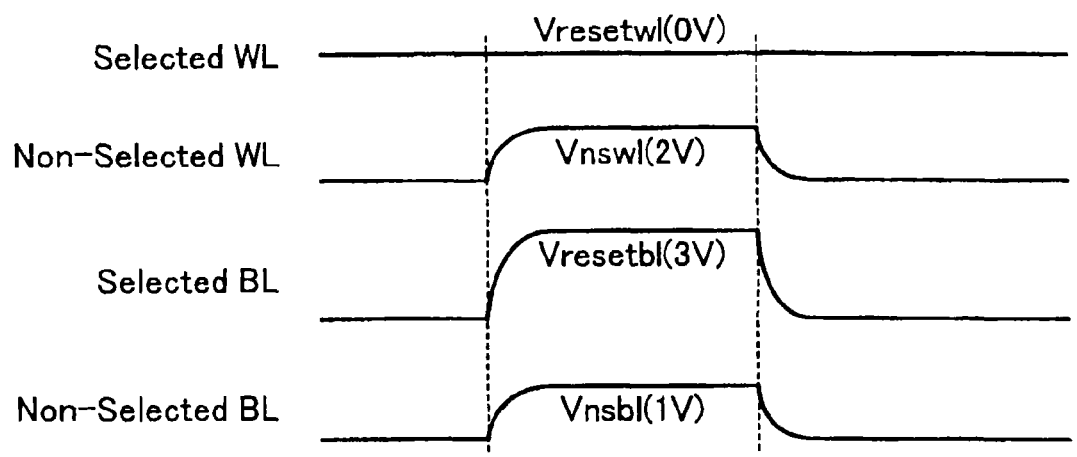
FIG. 17B shows a diagram of operating waveforms in each MAT at the time of "1" write in the same embodiment.
Figure 18:
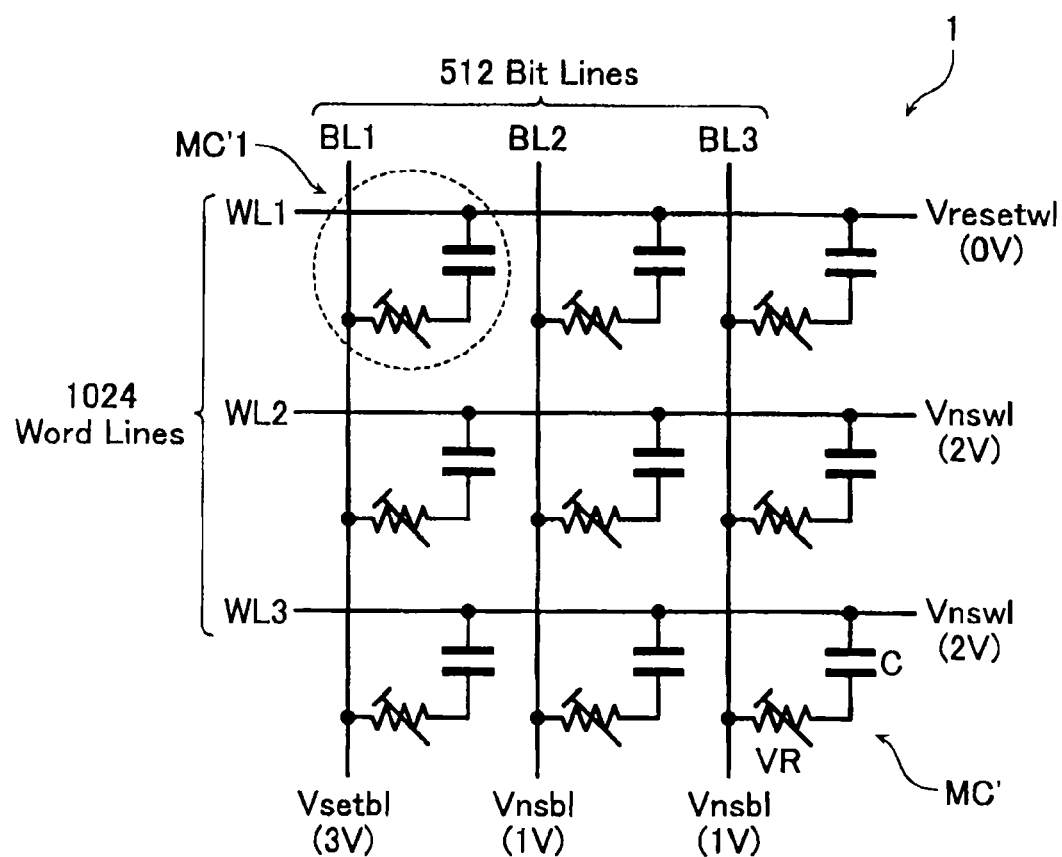
FIG. 18 is a diagram showing a circuit in the MAT and voltages supplied to lines at the time of "1" write in the same embodiment.

FIGS. 17A and 17B are diagrams of operating waveforms in each MAT 1 at the time of "0" write and at the time of "1" write in a nonvolatile memory according to a fifth embodiment of the present invention. FIG. 18 is a diagram showing a circuit in the MAT 1 and voltages supplied to lines at the time of "1" write in the same embodiment.

In the case of the present embodiment, "0" writing is similar to that in the fourth embodiment.

The following description is given to the case where "1" is written in the memory cell MC'1 surrounded by the dotted line in FIG. 18. In this case, the voltages supplied to the selected word line WL1 and non-selected word lines WL and the voltages supplied to the selected bit line BL1 and non-selected bit lines BL at the time of "0" writing are mutually interchanged and supplied. In a word, the selected word line WL1 is supplied with a word line reset voltage Vresetwl of 0 V, and non-selected word lines WL with a word line non-selection voltage Vnswl of 2 V. In addition, the selected bit line BL1 is supplied with a bit line reset voltage Vresetbl of 3 V, and non-selected bit lines BL with a bit line non-selection voltage Vnsbl of 1 V, respectively. As a result, the selected memory cell MC'1 makes a transition to the high-resistance state while other memory cells MC make no transition in the resistance state. Thus, "1" can be written in only the memory cell MC'1.

Thus, in the present embodiment, voltages supplied to word lines WL and bit lines BL are interchanged mutually in accordance with input data to exert the similar effect to that in the fourth embodiment as well.

Others

Nonvolatile memories, particularly resistance variable memories have been described above though the first through third embodiments are also applicable to other semiconductor memory devices.

What is claimed is:

1. A nonvolatile semiconductor memory device, comprising:
   a cell array including a plurality of MATs (unit cell arrays), each MAT having a plurality of first lines, a plurality of second lines intersecting the first lines, and a plurality of memory cells connected at intersections of the first and second lines between both lines, each memory cell having an electrically erasable programmable variable resistive element;
   a pulse generator operative to generate pulses;
   a plurality of control circuits each corresponding to one of the MATs, each of the control circuits including a row control circuit and a column control circuit, the row control circuit being operative to receive one of the pulses and transfer the pulse to a selected one of the first lines, the column control circuit being operative to receive one of the pulses and transfer the pulse to a selected one of the second lines; and
   a controller operative to control the pulse generator and the control circuits to execute data write to a selected one of the memory cells of a first MAT of the MATs and to execute data erase to a selected one of the memory cells of a second MAT of the MATs at the same time.

2. The nonvolatile semiconductor memory device according to claim 1, wherein the pulse generator is operative to generate a write voltage for data write and an erase voltage for data erase at the same time, and each of the control circuits includes a selection circuit operative to receive the write voltage and the erase voltage from the pulse generator, select from among these voltages in accordance with input data, and transfer the selected voltage to the selected first line or the selected second line.

3. The nonvolatile semiconductor memory device according to claim 2, wherein the selection circuit is operative to select the write voltage or the erase voltage only for the application time thereof and transfer the selected voltage to the selected first line or the selected second line, and select a recovery voltage and transfer it to the selected first line or the selected second line.

4. The nonvolatile semiconductor memory device according to claim 2, wherein the write voltage and the erase voltage are different.

5. The nonvolatile semiconductor memory device according to claim 1, wherein the controller is operative to control the pulse generator and the control circuits to repeat write/erase and verify on a selected one of the memory cells until data held in the selected memory cell matches input data.

6. The nonvolatile semiconductor memory device according to claim 1, wherein the controller does not control the control circuits to access a MAT having a selected one of the memory cells when data held in the selected memory cell is equal to input data.

7. The nonvolatile semiconductor memory device according to claim 1, further comprising a current limit circuit operative to limit a value of current flowing in a selected one of the memory cells when input data is write data.

8. The nonvolatile semiconductor memory device according to claim 1, wherein each of the memory cells includes a non-ohmic element serially connected to the variable resistive element, the non-ohmic element being a diode.

9. The nonvolatile semiconductor memory device according to claim 1, wherein each of the memory cells includes a non-ohmic element serially connected to the variable resistive element, the non-ohmic element being a capacitor.

10. The nonvolatile semiconductor memory device according to claim 9, wherein the controller is operative to control the pulse generator and the control circuits to supply a voltage to a selected one of the memory cells, the voltage having an opposite polarity at the time of data write to that at the time of data erase.

11. The nonvolatile semiconductor memory device according to claim 9, wherein the controller is operative to control the pulse generator and control circuits to interchange the voltages supplied to the first and second lines at the time of data write in contrast to those at the time of data erase for a selected one of the memory cells.

12. The nonvolatile semiconductor memory device according to claim 1, further comprising a buffer, wherein the controller is operative to transfer n bits of data on a one bit basis to n of the control circuits via the buffer when inputting the n bits data, n being an integer of 2 or more.

13. The nonvolatile semiconductor memory device according to claim 12, wherein the controller is operative to control the n control circuits each to access a selected one of the memory cells of a corresponding MAT.

14. The nonvolatile semiconductor memory device according to claim 1, wherein the controller is operative to control the pulse generator and the control circuits to not execute data erase to a selected one of the memory cells before executing data write to the selected memory cell.

* * * * *